(12) United States Patent
Ito et al.

(10) Patent No.: US 8,461,610 B2
(45) Date of Patent: Jun. 11, 2013

(54) SEMICONDUCTOR LIGHT EMITTING DEVICE HAVING A REFLECTIVE MATERIAL WITH A SIDE SLANT SURFACE AND METHOD OF MANUFACTURING

(75) Inventors: Kosaburo Ito, Tokyo (JP); Toshihiro Seko, Tokyo (JP); Kazuhiko Ueno, Tokyo (JP); Soji Owada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 127 days.

(21) Appl. No.: 13/162,151

(22) Filed: Jun. 16, 2011

(65) Prior Publication Data
US 2011/0309388 A1 Dec. 22, 2011

(30) Foreign Application Priority Data

Jun. 16, 2010 (JP) .................................. 2010-137365

(51) Int. Cl.
*H01L 33/00* (2010.01)

(52) U.S. Cl.
USPC ................ 257/98; 257/79; 257/99; 257/100; 257/E33.072; 362/243; 362/555; 313/501; 313/485; 438/22; 438/28

(58) Field of Classification Search
USPC ..................... 257/E33.072; 362/243; 313/501
See application file for complete search history.

(56) References Cited

U.S. PATENT DOCUMENTS

| | | | |
|---|---|---|---|
| 7,078,732 B1 | 7/2006 | Reeh et al. | |
| 7,679,100 B2 | 3/2010 | Schwenkschuster et al. | |
| 2006/0022211 A1 | 2/2006 | Yatsuda et al. | |
| 2007/0086148 A1 | 4/2007 | Schwenkschuster et al. | |
| 2008/0054279 A1 | 3/2008 | Hussell et al. | |
| 2009/0001490 A1 | 1/2009 | Bogner et al. | |
| 2009/0134417 A1 | 5/2009 | Sato et al. | |

(Continued)

FOREIGN PATENT DOCUMENTS

| | | |
|---|---|---|
| EP | 1 189 291 A2 | 3/2002 |
| JP | 11-340515 A | 12/1999 |

(Continued)

OTHER PUBLICATIONS

List of Potentially Related Pending U.S. Patent Applications citing U.S. Appl. No. 13/196,868 to Kosaburo Ito et al., filed Aug. 2, 2011.

(Continued)

*Primary Examiner* — Marcos D. Pizarro
*Assistant Examiner* — Cesar Lopez
(74) *Attorney, Agent, or Firm* — Kenealy Vaidya LLP

(57) ABSTRACT

A semiconductor light-emitting device and a method for manufacturing the same can include a wavelength converting layer located over at least one semiconductor light-emitting chip in order to emit various colored lights including white light. The semiconductor light-emitting device can include a base board, a frame located on the base board, the chip mounted on the base board, a transparent material layer located between the wavelength converting layer and a side surface of the chip so as to extend toward the wavelength converting layer, and a reflective material layer disposed at least between the frame and both side surfaces of the wavelength converting layer and the transparent material layer. The semiconductor light-emitting device can be configured to improve light-emitting efficiency of the chip by using the reflective material layer as a reflector, and therefore can emit a wavelength-converted light having a high light-emitting efficiency from a small light-emitting surface.

21 Claims, 12 Drawing Sheets

U.S. PATENT DOCUMENTS

| | | |
|---|---|---|
| 2009/0159912 A1 | 6/2009 | Engl et al. |
| 2011/0180822 A1 | 7/2011 | Ruhnau et al. |
| 2012/0112220 A1* | 5/2012 | West et al. ............. 257/98 |

FOREIGN PATENT DOCUMENTS

| | | | |
|---|---|---|---|
| JP | 2004-31989 | A | 1/2004 |
| JP | 2004-40099 | A | 2/2004 |
| JP | 2006-48934 | A | 2/2006 |
| JP | 2007-103937 | A | 4/2007 |
| JP | 2008-507850 | A | 3/2008 |
| JP | 2008-103688 | A | 5/2008 |
| JP | 2009-135136 | A | 6/2009 |
| JP | 2009-526377 | A | 7/2009 |
| JP | 2009-218274 | A | 9/2009 |
| JP | 2010-118531 | A | 5/2010 |

OTHER PUBLICATIONS

List of Potentially Related Pending U.S. Patent Applications citing U.S. Appl. No. 13/196,868 to Kosaburo Ito et al., filed Aug. 2, 2011, and U.S. Appl. No. 13/229,063 to Toshihiro Seko et al., filed Sep. 9, 2011.

List of Potentially Related Pending Applications citing U.S. Appl. No. 13/355,754 to Takeshi Waragawa et al., filed Jan. 23, 2012.

List of Potentially Related Pending U.S. Appl. No. 13/325,038 to Takeshi Waragawa et al., filed Dec. 13, 2011.

\* cited by examiner

FIG. 8a
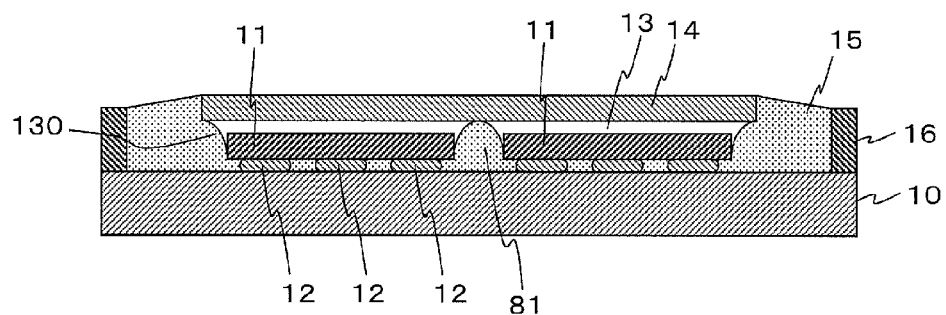
FIG. 8b (Sample A)
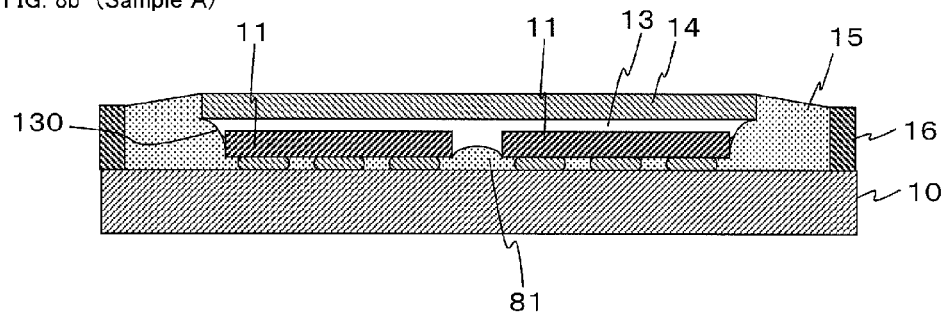
FIG. 8c
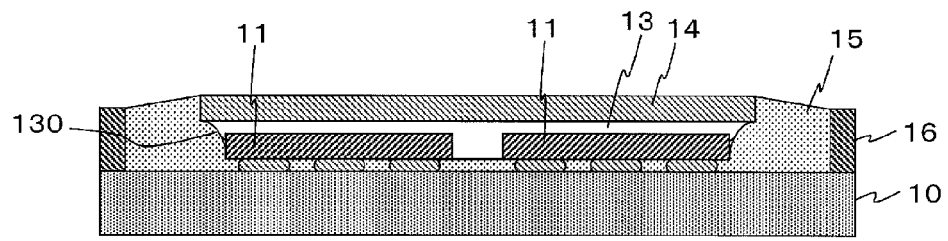

FIG. 9a (Sample B)
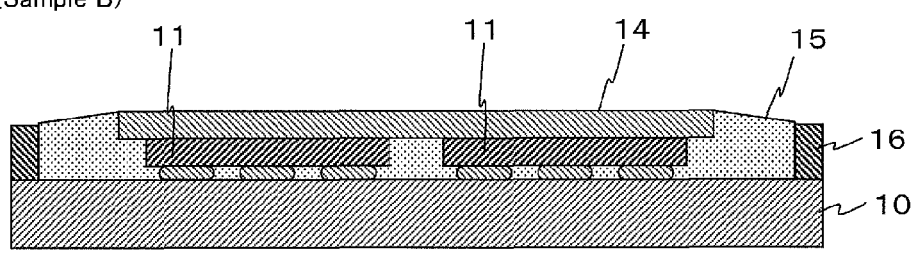
FIG. 9b (Sample C)
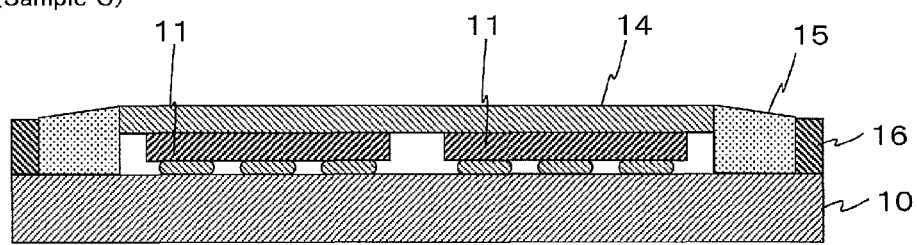

US 8,461,610 B2

SEMICONDUCTOR LIGHT EMITTING DEVICE HAVING A REFLECTIVE MATERIAL WITH A SIDE SLANT SURFACE AND METHOD OF MANUFACTURING

This application claims the priority benefit under 35 U.S.C. §119 of Japanese Patent Application No. 2010-137365 filed on Jun. 16, 2010, which is hereby incorporated in its entirety by reference.

BACKGROUND

1. Field

The presently disclosed subject matter relates to semiconductor light-emitting devices in which light emitted from a semiconductor light-emitting chip is wavelength-converted by a wavelength-converting layer, and to manufacturing methods for the same. More particularly, the disclosed subject matter relates to semiconductor light-emitting devices for a vehicle light and the like, which can emit light having a high light-emitting efficiency from a small light-emitting surface, and to methods of manufacturing such devices.

2. Description of the Related Art

Semiconductor light-emitting devices, in which a part of the light emitted from a semiconductor light-emitting chip is converted into light having a different wavelength by a phosphor and in which a mixture light comprises the light having the different wavelength mixed with the light emitted directly from the light-emitting chip is emitted, have been used as a light source for various lighting units. Conventional semiconductor light-emitting devices including a wavelength material, for example, are disclosed in Patent Document No. 1 (Japanese Patent Application Laid Open JP2004-31989).

FIGS. 11a and 11b are respectively side cross-section views showing a conventional lead frame type light-emitting device and a conventional radial type light-emitting device, which are disclosed in Patent Document No. 1. The conventional lead frame type light-emitting device 20 includes: a casing 26 having a cavity 27; a pair of lead frames 22, 23 located on a bottom surface of the cavity 27 of the casing 26; a semiconductor light-emitting chip 21 having a bottom electrode and a top electrode mounted on the lead frame 22, the bottom electrode electrically connected to the lead frame 22, and the top electrode electrically connected to the lead frame 23 via a bonding wire 24; and a phosphor resin 25 located on an opening of the cavity 27 of the casing 26 so as to be able to wavelength-convert light emitted from the semiconductor light-emitting chip 21.

The conventional radial type light-emitting device 30 includes: a casing 36 composed a transparent resin; a pair of lead frames 32, 33 located in the casing 36; a semiconductor light-emitting chip 31 having a first electrode and a second electrode mounted in a cup of the lead frame 32, the first electrode electrically connected to the lead frame 32 via a bonding wire 34a, and the second electrode electrically connected to the lead frame 33 via a bonding wire 34b; a phosphor resin 35 disposed in the cup of the lead frame 32 so as to encapsulate the semiconductor light-emitting chip 31.

The lead frame type light-emitting device 20 may emit a wavelength-converted light via the phosphor resin 25 so as to expand the light from the cavity 27 of the casing 26. Accordingly, it may be difficult for the lead frame type light-emitting device 20 to reduce a light-emitting surface. Additionally, the radial type light-emitting device 30 may emit a wavelength-converted light in a radial fashion from the casing 36, and therefore may also be difficult to reduce a light-emitting surface.

However, when the semiconductor light-emitting devices are used as a light source for a lighting unit such as a vehicle headlight, which controls light emitted from the light-emitting devices using a reflector and/or a projector lens, a light-emitting device having a small light-emitting surface may be desired to efficiently control light emitted from the light-emitting device with a small optical structure. Therefore, the semiconductor light-emitting devices disclosed in Patent Document No. 1 may not be a match for the above-described usage.

A semiconductor light-emitting device having a small light-emitting surface can be used as a light source for a vehicle headlight using a projector lens and is disclosed in Patent Document No. 2 (Japanese Patent Application Laid Open JP2009-218274). FIG. 12 is a cross-section view showing the conventional semiconductor light-emitting device disclosed in Patent Document No. 2.

The conventional semiconductor light-emitting device 40 includes: a base board 42; semiconductor light-emitting chips 41 mounted on the base board 42; a wavelength converting layer 45 disposed on the semiconductor light-emitting chips 41; and a reflecting member 46 located around the semiconductor light-emitting chips 41 and the wavelength converting layer 45 so as to encapsulate the semiconductor light-emitting chips 41 along with the base board 42 and the wavelength converting layer 45.

The conventional semiconductor light-emitting device 40 can emit a wavelength-converted light from a small light-emitting surface via the wavelength converting layer 45, because the light-emitting surface of the conventional semiconductor light-emitting device 40 can become nearly equal to top surfaces of the semiconductor light-emitting chips 41. In addition, because light emitted from side surfaces of the semiconductor light-emitting chips 41 and the wavelength converting layer 45 may be reflected into the semiconductor light-emitting chips 41 and the wavelength converting layer 45 by the reflecting member 46 and may be emitted from a top surface of the wavelength converting layer 45, a light intensity in a frontward direction of the conventional light-emitting device 40 may improve.

However, when a side surface of the reflecting member 46 is located perpendicular to the base board 42 mounting the semiconductor light-emitting chips 41 in the semiconductor light-emitting device 40 as shown in FIG. 12, light reflected on the side surface of the reflecting member 46, which contacts with the side surfaces of the semiconductor light-emitting chips 41, may return into the semiconductor light-emitting chips 41. Accordingly, because an absorbing band of the semiconductor light-emitting chips 41 includes a wavelength of the reflected light, the reflected light and an absorbing light may increase in the semiconductor light-emitting chips 41. The increase of the reflected light and the absorbing light may cause a decrease in a total amount of light flux emitted from the conventional semiconductor light-emitting device 40.

The above-referenced Patent Documents are listed below, and are hereby incorporated with their English abstracts in their entireties.

1. Patent Document No. 1: Japanese Patent Application Laid Open JP2004-31989
2. Patent Document No. 2: Japanese Patent Application Laid Open JP2009-218274

The disclosed subject matter has been devised to consider the above and other problems, features, and characteristics. Thus, embodiments of the disclosed subject matter can include semiconductor light-emitting devices that can emit a wavelength-converted light having a high light-emitting efficiency from a small light-emitting surface, and associated manufacturing methods that do not cause and/or are designed to prevent some of the above-described problems, concerns, and characteristics related to a wavelength converting layer. The disclosed subject matter can also include a semiconductor light-emitting device using a plurality of semiconductor light-emitting chips that can be used for wavelength-converting light having a high light-emitting efficiency from a small light-emitting surface.

SUMMARY

The presently disclosed subject matter has been devised in view of the above and other problems, features, and characteristics. An aspect of the disclosed subject matter includes methods of manufacture that provide semiconductor light-emitting devices having a small light-emitting surface and a high light-emitting efficiency and which can provide a similar lead time while using a similar manufacture machine in comparison with conventional semiconductor light-emitting devices and processes.

According to an aspect of the disclosed subject matter, a semiconductor light-emitting device can include: a base board having conductor patterns formed on a mounting surface thereof; a semiconductor light-emitting chip including chip electrodes adjacent a bottom surface thereof, each of the chip electrodes electrically connected to a respective portion of the conductor pattern of the base board via solder bumps; a wavelength converting layer including at least one phosphor and located over a top surface of the semiconductor light-emitting chip so that a bottom surface thereof covers the top surface of the semiconductor light-emitting chip; a transparent material layer disposed between the bottom surface of the wavelength converting layer and a side surface of the semiconductor light-emitting chip so that a side surface thereof extends from the side surface of the semiconductor light-emitting chip toward the bottom surface of the wavelength converting layer; and a frame located on the mounting surface of the base board so as to surround the semiconductor light-emitting chip and the transparent material layer.

Additionally, the semiconductor light-emitting device can include a reflective material layer having a side slant surface disposed at least between the frame and both side surfaces of the wavelength converting layer and the transparent material layer and between the bottom surface of the semiconductor light-emitting chip and the mounting surface of the base board while surrounding the solder bumps, wherein the side slant surface contacting with the side surface of the transparent material layer is configured to extend from the side surface of the semiconductor light-emitting chip toward the bottom surface of the wavelength converting layer.

In the above-described exemplary semiconductor light-emitting device, the side slant surface of the reflective material layer can be formed in at least one of a substantially linear shape and a convex shape having a curvature of 5 or less in a direction toward the semiconductor light-emitting chip between the side surface of the semiconductor light-emitting chip and the bottom surface of the wavelength converting layer. The semiconductor light-emitting chip can be a blue light-emitting chip and the at least one phosphor of the wavelength converting layer can be selected from the group consisting of a yellow phosphor, and two phosphors including a red phosphor layer and a green phosphor layer. The semiconductor light-emitting chip can also be an ultraviolet light-emitting chip and the at least one phosphor of the wavelength converting layer can include at least one of a red phosphor, a green phosphor, and a blue phosphor.

According to the above-described exemplary semiconductor light-emitting device, the device can emit a wavelength-converted light from a top surface of the wavelength converting layer that is slightly larger than the top surface of the semiconductor light-emitting chip while the side slant of the transparent material layer can be used as a reflector that extends from the side surface of the semiconductor light-emitting chip toward the bottom surface of the wavelength converting layer. Furthermore, the device can also include a plurality of semiconductor light-emitting chips with the above-described structures as set forth in the three immediately preceding paragraphs. Thus, the disclosed subject matter can provide semiconductor light-emitting devices that can emit a wavelength-converted light having a high light-emitting efficiency from a small light-emitting surface.

Another aspect of the disclosed subject matter includes methods for manufacturing the above-described semiconductor light-emitting devices. An exemplary method can include: providing the base board; connecting each of the chip electrodes of the semiconductor light-emitting chip to a respective portion of the conductor pattern of the base board via the solder bump; disposing an uncured transparent material between the bottom surface of the wavelength converting layer and the side surface of the semiconductor light-emitting chip so as to extend from the side surface of the semiconductor light-emitting chip toward the bottom surface of the wavelength converting layer; and disposing an uncured reflective material at least between the frame and both side surfaces of the wavelength converting layer and the transparent material layer and between the bottom surface of the semiconductor light-emitting chip and the mounting surface of the base board.

In the above-described exemplary method for manufacturing semiconductor light-emitting devices, the same or similar variations of the device can also be employed as set forth above.

According to the exemplary manufacturing method described above for the semiconductor light-emitting devices, the side slant surface of the reflective material layer used as the reflector can be formed by disposing an uncured reflective material between the frame and both side surfaces of the wavelength converting layer and the transparent material layer. The transparent material layer and the reflective material layer can be solidified by a similar method as compared to conventional processes. Thus, the method can provide semiconductor light-emitting devices having a small light-emitting surface and a high light-emitting efficiency using manufacturing machines that are similar to those used to manufacture conventional semiconductor light-emitting devices.

BRIEF DESCRIPTION OF THE DRAWINGS

These and other characteristics and features of the disclosed subject matter will become clear from the following description with reference to the accompanying drawings, wherein:

FIGS. 8a to 8c are side cross-section views showing second exemplary embodiments including a plurality of light-emitting chips of a semiconductor light-emitting device made in accordance with principles of the disclosed subject matter;

FIGS. 9a and 9b are cross-section views depicting exemplary comparative embodiments including a plurality of light-emitting chips of a semiconductor light-emitting device;

DETAILED DESCRIPTION OF EXEMPLARY EMBODIMENTS

Figure 1:
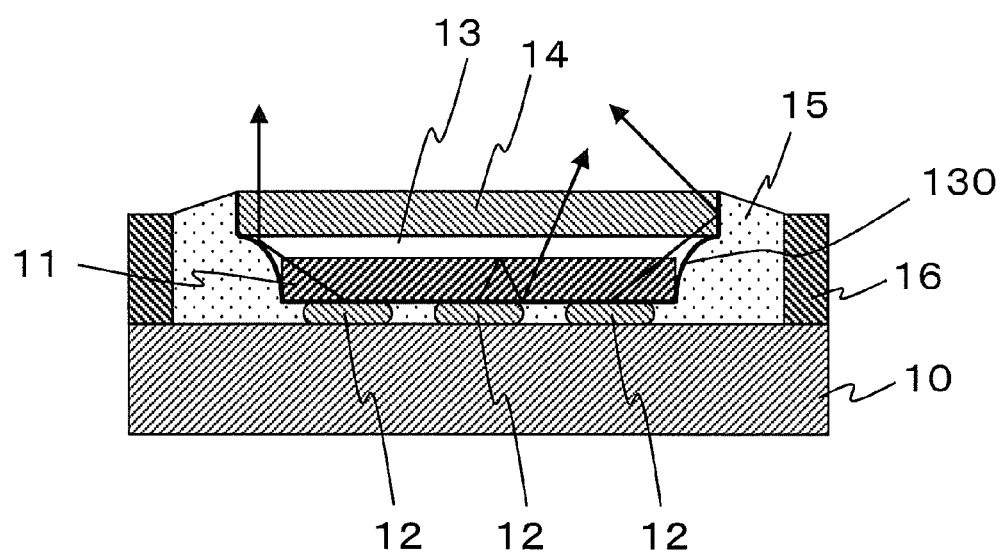
FIG. 1 is a side cross-section view showing a first exemplary embodiment of a semiconductor light-emitting device made in accordance with principles of the disclosed subject matter.

Exemplary embodiments and manufacturing methods of the disclosed subject matter will now be described in detail with reference to FIGS. 1 to 10. FIG. 1 is a side cross-section view showing a first exemplary embodiment of a semiconductor light-emitting device made in accordance with principles of the disclosed subject matter.

The semiconductor light-emitting device can include: a base board 10 having a mounting surface and conductor patterns (not shown in FIG. 1) formed on the mounting surface; a semiconductor light-emitting chip 11 having a top surface, a bottom surface, a side surface and chip electrodes adjacent the bottom surface mounted on the mounting surface of the base board 10 via solder bumps 12, and each of the chip electrodes electrically connected to respective conductor patterns of the base board 10 via the solder bumps 12; and a wavelength converting layer 14 having a top surface, a bottom surface and a side surface located over the top surface of the semiconductor light-emitting chip 11, and the top surface and bottom surface thereof being slightly larger than the top surface of the semiconductor light-emitting chip 11.

In addition, the semiconductor light-emitting device can include; a transparent material layer 13 disposed between the side surface of the semiconductor light-emitting chip 11 and the bottom surface of the wavelength converting layer 14 so as to extend from the side surface of the semiconductor light-emitting chip 11 toward the bottom surface of the wavelength converting layer 14; a frame 16 located along an outer circumference of the base board 10 so as to surround the semiconductor light-emitting chip 11 and the transparent material layer 13; and a reflective material layer 15 made of a material having a high reflectivity, disposed between the frame 16 and side surfaces of the wavelength converting layer 14 and the transparent material layer 13 and disposed between the bottom surface of the semiconductor light-emitting chip 11 and the mounting surface of the base board 10 so as to fill a space between the solder bumps 12.

By disposing the reflective material layer 15 between the bottom surface of the semiconductor light-emitting chip 11 and the mounting surface of the base board 10 so as to fill the space between the solder bumps 12, light emitted in a downward direction of the semiconductor light-emitting chip 11 from the light-emitting chip 11 can be reflected on the reflective material layer 15 and can be emitted from the top surface of the semiconductor light-emitting chip 11. Accordingly, light use efficiency of the semiconductor light-emitting device can improve.

The bottom surface of the wavelength material layer 14 can be slightly larger than the top surface of the semiconductor light-emitting chip 11, and the wavelength material layer 14 can be located over the semiconductor light-emitting chip 11 so that the bottom surface of the wavelength material layer 14 can cover the top surface of the semiconductor light-emitting chip 11. In other words, an outermost periphery of the semiconductor light-emitting chip 11 will be completely blocked from view by the wavelength material layer 14 when the device is viewed from a position on the main optical axis which extends normal to the top center surface of the chip 11. Therefore, a side slant surface 130 formed on a boundary between the reflective material layer 15 and the transparent material layer 13 can become a reflective surface, which can reflect light emitted in a crosswise direction from the light-emitting chip 11 toward the bottom surface of the wavelength material layer 14.

That is to say, the reflective material layer can perform as a reflector for the semiconductor light-emitting chip 11 by using the side slant surface 130 and the boundary surface contacting with the bottom surface of the semiconductor light-emitting chip 11. Thus, the semiconductor light-emitting device can improve light-emitting efficiency as compared with the conventional device.

In addition, because the reflective material layer 15 contacts with the side surface of the wavelength converting layer 14, the top surface of the wavelength converting layer 14 can perform as a light-emitting surface of the semiconductor light-emitting device. Thus, the disclosed subject matter can realize a very small light-emitting surface that is slightly larger than the top surface of the semiconductor light-emitting chip 11, by using the top surface of the wavelength converting layer 14.

Figure 2A:
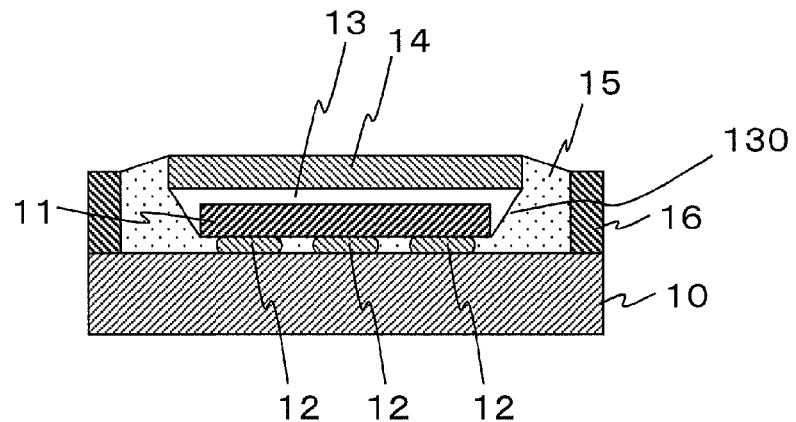
FIGS. 2a to 2c are side cross-section views depicting the semiconductor light-emitting device of FIG. 1, wherein a slant surface 130 of a reflecting material layer 15 is respectively formed in a linear shape, in a convex shape in an outward direction of the device, and in a convex shape in an inward direction of the device.
Figure 2B:
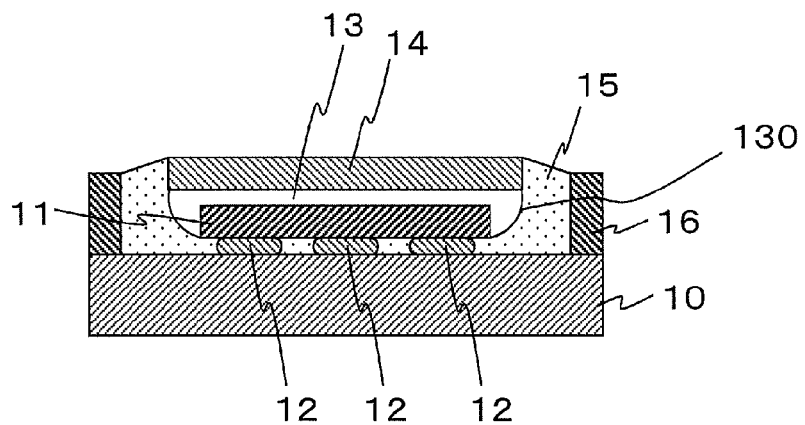
Figure 2C:
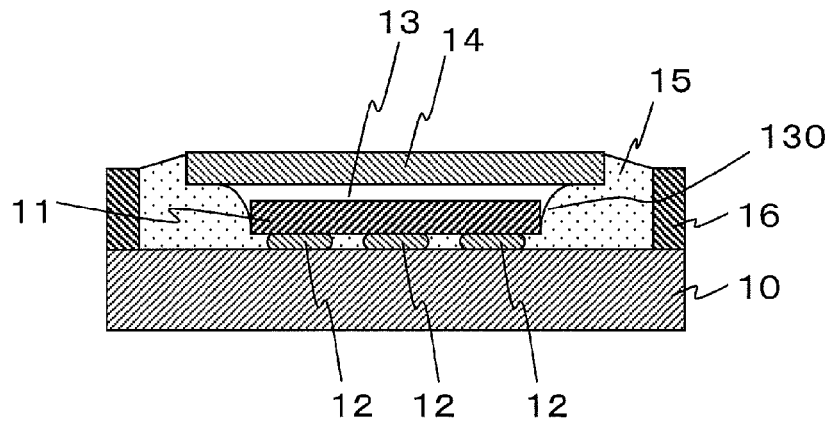

FIGS. 2a to 2c are side cross-section views depicting the semiconductor light-emitting device of FIG. 1, wherein the side slant surface 130 of the reflecting material layer 15 for each embodiment is different from each other. The side slant surface 130 can be formed in a linear shape connecting an end of the bottom surface of the wavelength converting layer 14 to an end of the bottom surface of the semiconductor light-emitting chip 11 as shown in FIG. 2a. The side slant surface 130 can also be formed in a concave shape extending in an outward direction away from a center of the semiconductor light-emitting device and in a convex shape extending in an inward direction towards a center of the device as shown in FIGS. 2b and 2c, respectively.

In these cases, the reflecting material layer 15 can include the side slant surface 130, which is formed in the linear shape as shown in FIG. 2a or in the convex shape in the inward direction of the semiconductor light-emitting device as shown in FIG. 2c, in order to increase light directed toward the bottom surface of the wavelength converting layer 14. When the side slant surface 130 is formed in the convex shape in the inward direction of the light-emitting device, a curvature of the convex shape can be formed at 5 or less as described in detail later.

An end of the side slant surface 130 toward the semiconductor light-emitting chip 11 does not always need be located at the end of the bottom surface of the semiconductor light-emitting chip 11. The end of the side slant surface 130 can be located on the side surface of the semiconductor light-emitting chip 11, which is between both ends of the top and bottom surface of the semiconductor light-emitting chip 11.

When the end of the side slant surface 130 is located on the side surface of the semiconductor light-emitting chip 11, the side slant surface 130 can become the reflex (e.g., a reflector type) surface, which can reflect light emitted in the crosswise direction of the semiconductor light-emitting chip 11 toward the bottom surface of the wavelength converting layer 14. The semiconductor light-emitting chip 11 can be mounted on the conductor patterns of the mounting surface of the base board 10 with a flip-chip structure. For example, electrodes that are coplanar with the bottom surface of the chip 11 can be connected to conductor patterns of the mounting surface of the base board 10. When the semiconductor light-emitting chip 11 is a flip-chip type chip, because a light-emitting layer of the semiconductor light-emitting chip 11 may be located close to the bottom surface of the semiconductor light-emitting chip 11, a reflex feature of the side slant surface 130 can be performed with high efficiency.

The base board 10 can include an Aluminum nitride substrate having a high thermal conductivity and the like, and the conductor patterns can be made from Au (gold) and the like and formed on the base board 10 to mount the semiconductor light-emitting chip 11 and to receive a power supply for the semiconductor light-emitting chip 11. The transparent material layer 13 can be formed of a transparent resin such as a silicone resin, an epoxy resin, etc.

The semiconductor light-emitting chip 11 can be blue LED chips having a peak wavelength of 460 nanometers. The wavelength converting layer 14 can include a phosphor to convert light emitted from the semiconductor light chip 11 into a particular wavelength or range of wavelengths of light. Thus, the phosphor can be excited by the light emitted from the semiconductor light-emitting chip 11, and can emit a wavelength-converted light. Accordingly, the semiconductor light-emitting device can emit a different wavelength from that of the semiconductor light-emitting chip 11 by an additive color mixture of a part of the light emitted from the semiconductor light-emitting chip 11 and the wavelength-converted light excited by another part of the light.

The wavelength converting layer 14 can include a resin layer that is made by mixing a yellow phosphor with a transparent resin such as a silicone resin and the like. The wavelength converting layer 14 can also include a glass plate including the yellow phosphor, and/or a phosphor ceramic plate such as YAG plate that is made by sintering the yellow phosphor such as YAG.

In these cases, the semiconductor light-emitting chip 11 can be a blue LED chip having a peak wavelength of 460 nanometers. The yellow phosphor can emit a yellow light upon being excited by blue light emitted from the blue LED chip. The semiconductor light-emitting device can emit substantially white light by an additive color mixture of the excited yellow light emitted from the yellow phosphor and a part of the blue light emitted from the blue LED chip.

The yellow phosphor can include, $Y_3Al_5O_{12}$: $Ce^{3+}$ (YAG), $(Sr, Ba)_2SiO_4$: $Eu^{2+}$, $Ca_x(Si, Al)_{12}(O, N)_{16}$: $Eu^{2+}$ and the like. In place of the yellow phosphor, a red phosphor wavelength-converting the blue light emitted from the blue LED chip into red-purple light, and a green phosphor wavelength-converting the blue light into blue-green light can also be used. In this case, the semiconductor light-emitting device can emit light having substantially white light by an additive color mixture of the red-purple light emitted from the red phosphor that is excited by the blue light, the blue-green light emitted from the green phosphor that is excited by the blue light and a part of the blue light.

The red phosphor can include $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like. $Y_3(Ga, Al)_5O_{12}$: $Ce^{3+}$, $Ca_3Sc_2Si_3O_{12}$: $Ce^{3+}$, $CaSc_2O_4$: $Eu^{2+}$, $(Ba, Sr)_2SiO_4$: $Eu^{2+}$, $Ba_3Si_6O_{12}N_2$: $Eu^{2+}$, $(Si, Al)_6(O, N)$: $Eu^{2+}$ and the like can be used as the green phosphor. The semiconductor light-emitting chip 11 can include an LED of InGaN series that emits near-ultraviolet light having a wavelength of approximately 380 nanometers, a laser diode that emits ultraviolet light, and the like.

In this case, in order to emit substantially white light, the at least one phosphor can include: a red phosphor wavelength-converting the ultraviolet light into red light; a green phosphor wavelength-converting the ultraviolet light into green light; and a blue phosphor wavelength-converting the ultraviolet light into blue light. $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like can be used as the red phosphor. $(Si, Al)_6(O, N)$: $Eu^{2+}$, $BaMgAl_{10}O_{17}$: $Eu^{2+}Mn^{2+}$, $(Ba, Sr)_2SiO_4$: $Eu^{2+}$ and the like can be used as the green phosphor. $(Sr, Ca, Ba, Mg)_{10}(PO_4)_6C_{12}$: $Eu^{2+}$, $BaMgAl_{10}O_{17}$: $Eu^{2+}$, $LaAl(Si, Al)_6(N, O)_{10}$: $Ce^{3+}$ and the like can be used as the blue phosphor.

The transparent material layer 13 can be a transparent resin, which can transmit light emitted from the semiconductor light-emitting chip 11 to the wavelength converting layer 14 and also can reflect light emitted in the crosswise direction from the light-emitting chip 11 toward the wavelength converting layer 14 with high efficiency. A transparent resin such as a silicone resin, an epoxy resin and the like can be used, and a transparent resin that is made by mixing a filler having a particle size of 0.001 to 50 micro meters with the above-described transparent resin and an inorganic material such as a glass and the like can be used as the transparent material layer 13.

The frame 16 can be formed from the same material as the base board 10, such as with aluminum nitride having a high thermal conductivity, ceramics, and the like. The frame 16 can be attached on the outer circumference of the mounting surface of the base board 10 via an adhesive material so as to surround the semiconductor light-emitting chip 11 and the transparent material layer 13 that is located between the semiconductor light-emitting chip 11 and the wavelength converting layer 14.

The reflective material layer 15 can be made by dispersing a reflective filler such as titanium oxide, zinc oxide and the like into a transparent resin such as a silicone resin and can be disposed between the frame 16 and both side surfaces of the wavelength converting layer 14 and the transparent material layer 13 so as to fill a apace between the bottom surface of the semiconductor light-emitting chip 11 and the mounting surface of the base board 10. A top surface of the reflective material layer 15 can be formed between an end of the top surface of wavelength converting layer 14 and an inner end of a top surface of the frame 16. Consequently, the semiconductor light-emitting device can be constructed so that the top surface of the wavelength converting layer 14 can become the light-emitting surface, which is slightly larger than the top surface of the semiconductor light-emitting chip 11.

According to the semiconductor light-emitting device having the above-described structure, light emitted in an upward direction from the semiconductor light-emitting chip 11 can enter into the wavelength converting layer 14 via the transparent material layer 13, and a wavelength converted light can be emitted from the top surface of the wavelength converting layer 14. Light emitted in a downward direction from the semiconductor light-emitting chip 11 can be reflected at the bottom surface of the light-emitting chip 11 by the reflective material layer 15, and a wavelength converted light can be emitted from the top surface of the wavelength converting layer 14 as well as the light emitted in the upward direction from the semiconductor light-emitting chip 11.

Light emitted in a crosswise direction from the semiconductor light-emitting chip 11 such as light emitted from the side surface of the light-emitting chip 11 can be reflected toward the wavelength converting layer 14 via the transparent material layer 13, by the side slant surface 130 that is formed at the boundary between the reflective material layer 15 and the transparent material layer 13.

Thereby, the light emitted in the crosswise direction of the light-emitting chip 11 can be prevented from being absorbed by the light-emitting chip 11 because the above described light may not return into the light-emitting chip 11. In addition, because a distance between the side surface of the light-emitting chip 11 and the reflective material layer 15 is very short, the light emitted in the crosswise direction of the light-emitting chip 11 can be prevented from being absorbed by the transparent material layer 13.

As described above, the light emitted from the semiconductor light-emitting chip 11 can enter into the wavelength converting layer 14 via the transparent material layer 13, directly or reflected by the reflective material layer 15. Therefore, the semiconductor light-emitting device can emit a different wavelength light from that of the semiconductor light-emitting chip 11 by use of an additive color mixture of part of the light emitted from the semiconductor light-emitting chip 11 and the wavelength-converted light excited by another part of the light via the wavelength converting layer 14. Light emitted in a crosswise direction from the wavelength converting layer 14 can be reflected into the wavelength converting layer 14 at the side surface of the wavelength converting layer 14 by the reflective material layer 15, and can be emitted from the top surface of the wavelength converting layer 14.

Therefore, the disclosed subject matter can provide a small semiconductor light-emitting device having a small light-emitting surface, which is the top surface of the wavelength converting layer 14. In this case, because the reflective material layer 15 can be formed in a reflector shape that extends from the semiconductor light-emitting chip 11 in a light-emitting direction of the light-emitting device, the light emitted in the crosswise direction of the light-emitting chip 11 can be prevented from returning to the light-emitting chip 11 and can be reflected toward the wavelength converting layer 14 by the side slant surface 130. Thus, the disclosed subject matter can provide a small semiconductor light-emitting device having a high light-emitting efficiency.

A manufacturing method for the above-described semiconductor light-emitting device will now be described in detail with reference to FIGS. 3a to 3e. FIGS. 3a to 3e are cross-section views showing an exemplary manufacturing process for the semiconductor light-emitting device made in accordance with principles of the disclosed subject matter.

Figure 3A:
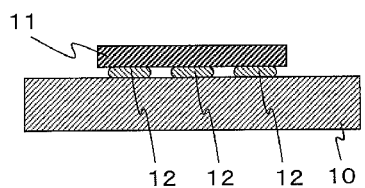
FIGS. 3a to 3e are cross-section schematic views showing an exemplary manufacturing process for the semiconductor light-emitting device made in accordance with principles of the disclosed subject matter.

Process (a) is preparing the base board 10 having the conductor patterns formed on the mounting surface and the semiconductor light-emitting chip 11, and mounting the semiconductor light-emitting chip 11 on the conductor patterns of the base board 10 via the solder bumps 12, as shown in FIG. 3a.

Figure 3B:
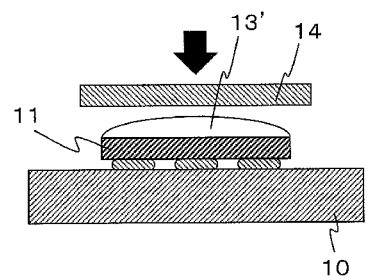

Process (b) is applying an uncured transparent material 13' such as a silicon resin on the top surface of the semiconductor light-emitting chip 11, and mounting the wavelength converting layer 14 that is formed in a plate shape and is formed in a slightly larger size than the top surface of the semiconductor light-emitting chip 14 on the uncured transparent material 13', as shown in FIG. 3b.

Figure 3C:
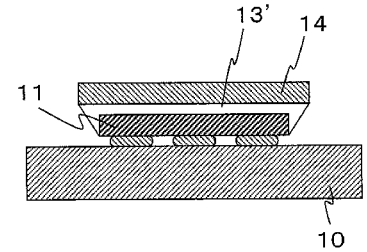
Figure 3D:
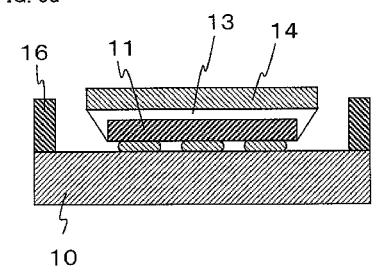
Figure 3E:
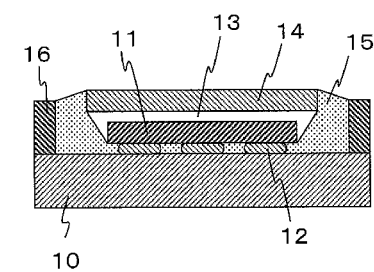

Process (c) is forming the reflector shape of the uncured transparent material 13' that extends to the bottom surface of the wavelength converting layer 14 from the side surface of the semiconductor light-emitting chip 11 by maintaining a surface tension while the uncured transparent material 13' covers at least the side surface of the semiconductor light-emitting chip 11, and solidifying the uncured transparent material 13' under a prescribed curing condition, as shown in FIG. 3c. In this case, the uncured transparent material 13' may be semi-solidified under a semi-curing condition if the reflector shape does not vary in following processes.

In the above-described process (c), when an amount of the uncured transparent material 13' is small, the side slant surface 130 may be formed in a convex shape in the inner direction of the light-emitting device as shown in FIG. 2c. When the amount of the uncured transparent material 13' increases, the side slant surface 130 may be formed in a substantially linear shape as shown in FIG. 2a. When the amount of the uncured transparent material 13' further increases, the side slant surface 130 may be formed in a concave surface extending in the outward direction of the light-emitting device as shown in FIG. 2b.

Process (d) is attaching the frame 16 on the outer circumference of the mounting surface of the base board 10 via the adhesive material so as to surround the semiconductor light-emitting chip 11 and the transparent material layer 13, which is located between the semiconductor light-emitting chip 11 and the wavelength converting layer 14.

Process (e) is disposing an uncured reflective material between the frame 16 and both side surfaces of the wavelength converting layer 14 and the transparent material layer 13 and in the apace between the bottom surface of the semiconductor light-emitting chip 11 and the mounting surface of the base board 10 so that the uncured reflective material can contact with both side surfaces of the wavelength converting layer 14 and the transparent material layer 13 without a space, by a dispenser and the like, thus forming the reflective material layer 15 including the above-described side slant surface 130 by solidifying the uncured reflective material under a prescribed curing condition, and finishing the semiconductor light-emitting device. The above process steps can be done consecutively and sequentially, or can be interchanged in timing and non-sequential.

By creating the side slant surface 130 of the transparent material layer 13 using the surface tension of the uncured transparent material, and by disposing the uncured reflective material between the frame 16 and the both side surfaces of the wavelength converting layer 14 and the transparent material layer 13, the side slant surface 130 of the reflective material layer 15 can be formed in a prescribed shape and the reflective material layer 15 can be attached to the side surface of the wavelength converting layer 14.

Thereby, the reflector shape having a predetermined shape can be formed from the side surface of the semiconductor light-emitting chip 11 to the bottom surface of the wavelength converting layer 14 without a machining process. In addition, the manufacturing method can also dispose the reflective material in the space between the bottom surface of the semiconductor light-emitting chip 11 and the mounting surface of the base board 10 when disposing the reflective material between the frame 16 and both side surfaces of the wavelength converting layer 14 and the transparent material layer 13.

Accordingly, the manufacturing method can prevent the semiconductor light-emitting chip 11 from absorbing light returned on the side surface of the light-emitting chip 11 and can also prevent a decay of light emitted in the downward direction of the light-emitting chip 11. Thus, the manufacturing method can provide semiconductor light-emitting devices having a high light-emitting efficiency. Moreover, because the light-emitting surface of the device is small, light emitted from the semiconductor light-emitting device can be efficiently controlled by a small and simple optical member. Furthermore, the manufacturing method can vary the shape of the side slant surface 130 of the reflective material layer 15 by adjusting the amount of the uncured transparent material 13', which is applied on the top surface of the semiconductor light-emitting chip 11.

Figure 4A:
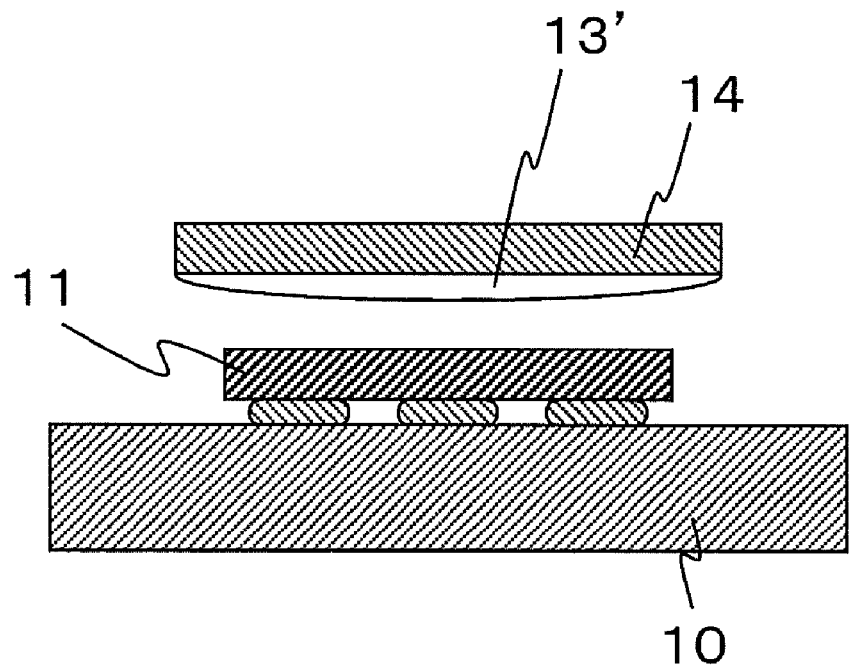
FIGS. 4a and 4b are cross-section views showing variations of an applying location of a transparent material in the process of FIG. 3b.
Figure 4B:
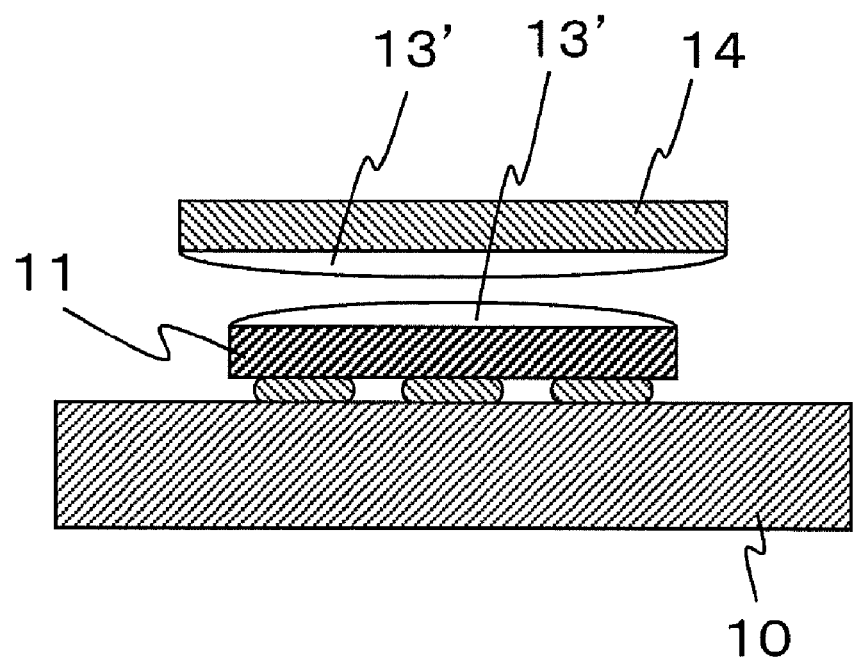

In the above-described manufacturing method, the uncured transparent material 13' is applied on the top surface of the semiconductor light-emitting chip 11 in process (b). However, the embodiment of the disclosed subject matter cannot be limited to this method. For example, the uncured transparent material 13' can be applied underneath the bottom surface of the wavelength converting layer 14 as shown in FIG. 4a, and also the uncured transparent material 13' can be applied both on the top surface of the semiconductor light-emitting chip 11 and underneath the bottom surface of the wavelength converting layer 14 as shown in FIG. 4b.

Figure 5A:
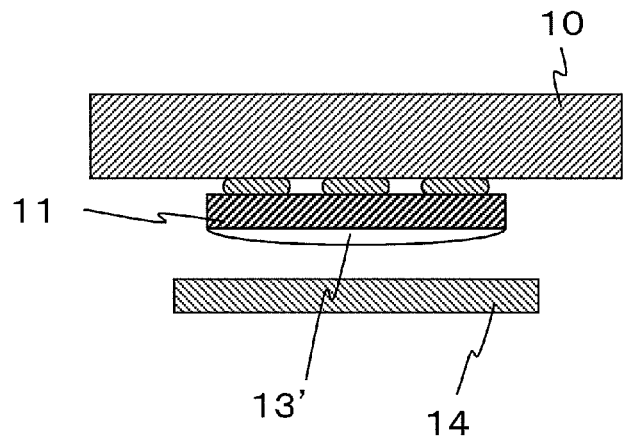
FIGS. 5a to 5c are cross-section views showing variations of the applying location of the transparent material when a semiconductor light-emitting chip is located in a downward direction in the process of FIG. 3b.
Figure 5B:
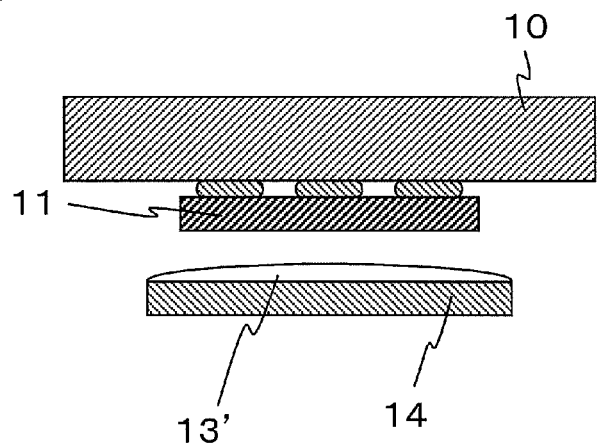
Figure 5C:
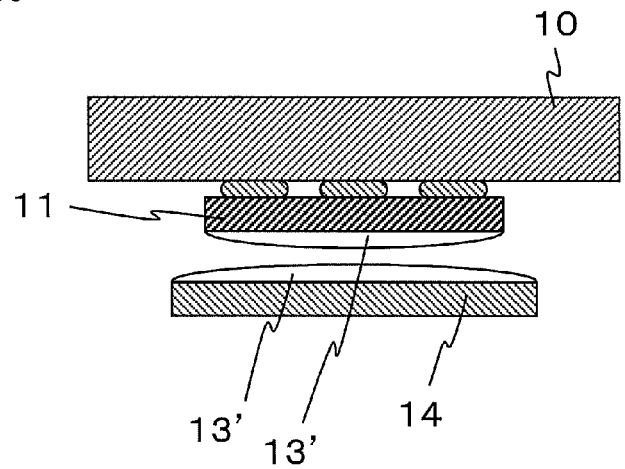

In addition, the uncured transparent material 13' can be disposed between the top surface of the semiconductor light-emitting surface 11 and the bottom surface of the wavelength converting layer 14 and around the side surface of the semiconductor light-emitting chip 11 while the semiconductor light-emitting chip 11 mounted on the base board 10 is directed downward, as shown in FIGS. 5a to 5c. In this case, the uncured transparent material 13' can be disposed between the top surface of the semiconductor light-emitting chip 11 and the bottom surface of the wavelength converting layer 14 and around the side surface of the semiconductor light-emitting chip 11 by applying the uncured transparent material 13' underneath the top surface of the semiconductor light-emitting chip 11, as shown in FIG. 5a.

Moreover, the uncured transparent material 13' can be disposed between the top surface of the semiconductor light-emitting chip 11 and the bottom surface of the wavelength converting layer 14 and around the side surface of the semiconductor light-emitting chip 11 by applying the uncured transparent material 13' on the bottom surface of the wavelength converting layer 14 as shown in FIG. 5b. The uncured transparent material 13' can also be disposed between the top surface of the semiconductor light-emitting chip 11 and the bottom surface of the wavelength converting layer 14 and around the side surface of the semiconductor light-emitting chip 11 by applying the uncured transparent material 13' both underneath the top surface of the semiconductor light-emitting chip 11 and on the bottom surface of the wavelength converting layer 14, as shown in FIG. 5c.

A curvature for the side slant surface 130 of the reflective material layer 15 will now be described in detail. The side slant surface 130 can be formed in a convex shape extending in an inward direction towards a center of the semiconductor light-emitting device in order to reflect the crosswise light emitted from the semiconductor light-emitting chip 11 toward the wavelength converting layer 14. In this case, for purpose of a search for a range of the curvature of the side slant surface 130, the number of rays that arrives at the wavelength converting layer 14 out of a total ray number emitted from the semiconductor light-emitting chip 11 is calculated by a computer simulation while the curvature of the side slant surface 130 is varied.

The semiconductor light-emitting chip 11 used for the computer simulation included a sapphire substrate having a refractive index of 1.8 and a thickness of 90 micro meters used as the chip substrate located in a upward direction of the light-emitting chip 11, and a gallium nitride (GaN) chip having a refractive index of 2.54 and a thickness of 10 micro meters was used as a semiconductor layer located underneath the sapphire chip substrate, and a thickness of the semiconductor light-emitting chip 11 was 0.1 mil meters. An absorbing factor of the semiconductor light-emitting chip 11 was considered by replacing with a reflectance of 0.71.

The transparent material layer 13 included a transparent material having a refractive index of 1.54 and a thickness of 0.01 mil meters between the top surface of the semiconductor light-emitting chip 11 and the bottom surface of the wavelength converting layer 14, for the computer simulation. A refractive index of the side slant surface 130 of the reflective material layer 15 was defined as 0.98.

Figure 6:
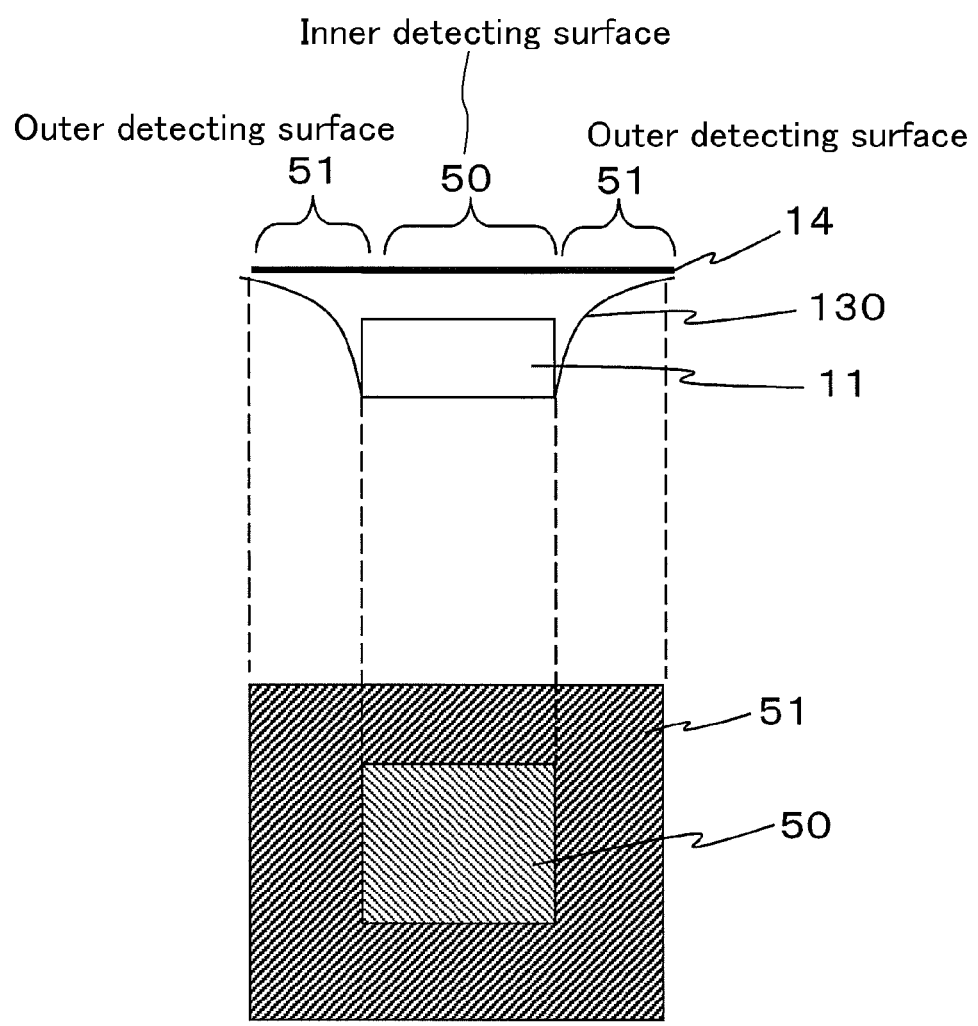
FIG. 6 is an explanatory diagram showing detecting surfaces where the number of rays is detected by a computer simulation using the first embodiment of the semiconductor light-emitting device shown in FIG. 1.

FIG. 6 is an explanatory diagram showing detecting surfaces where the number of rays was detected by the computer simulation under the above-described conditions. As the detecting surfaces of the wavelength converting layer 14, a region located right above the top surface of the semiconductor light-emitting chip 11 is defined as an inner detecting surface 50, and another region located outside of the inner detecting surface 50 is defined as an outer detecting surface 51.

Figure 7A:
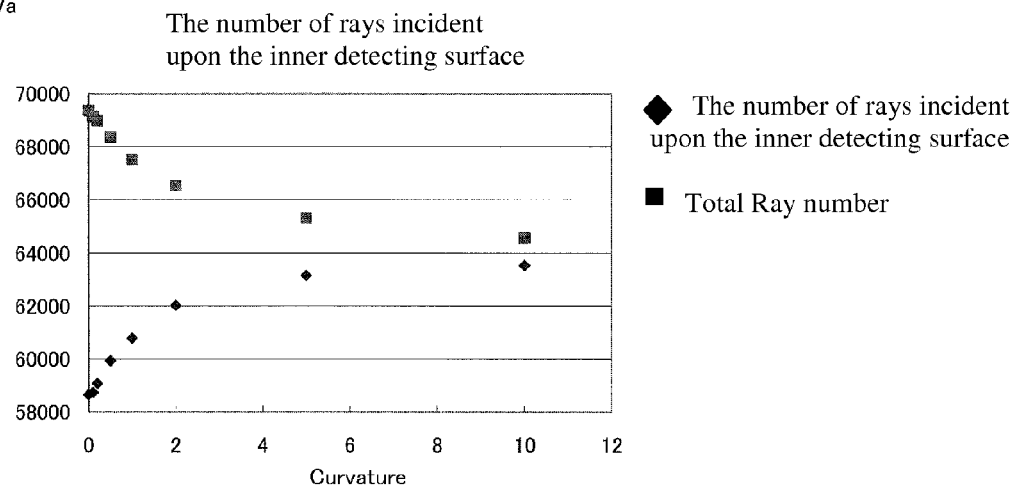
FIGS. 7a and 7b are charts showing the number of rays with respect to an inner detecting surface and the number of rays with respect to an outer detecting surface, respectively, which are calculated by a computer simulation using the first embodiment of the semiconductor light-emitting device shown in FIG. 1.
Figure 7B:
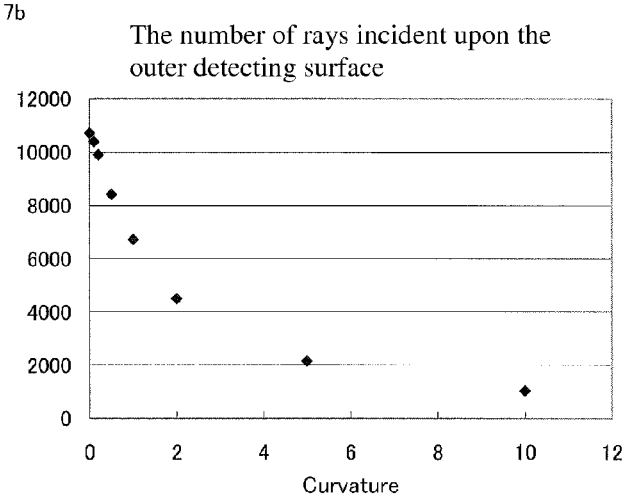

FIGS. 7a and 7b are charts showing the number of rays incident on the inner detecting surface 50 and the number of rays incident on the outer detecting surface 51, respectively, which were calculated by the computer simulation under the above described conditions. The number of rays incident on the inner detecting surface 50 may not substantially vary when the curvature of the side slant surface 130 is larger than 5, and when the curvature is less than 5, the number of rays incident on the inner detecting surface 50 may decrease, as shown in FIG. 7a.

However, when the curvature is less than 5, the number of rays incident on the outer detecting surface 51 may increase, as shown in FIG. 7b. Therefore, a total ray number of the numbers of rays incident on the inner and the outer detecting surfaces 50, 51 can obviously increase when the curvature of the side slant surface 130 is less than 5, as shown in FIG. 7a. Thus, the side slant surface 130 of the reflective material layer 15 can be formed in a convex shape having a curvature of 5 or less in the inward direction of the light-emitting device.

The reason why the total ray number incident on the inner and the outer detecting surfaces 50, 51 does not substantially increase when the curvature of the side slant surface 130 is larger than 5 may be that the number of rays incident on the outer detecting surface 51 does not substantially increase because a part of the side slant surface 130 located close to the side surface of the semiconductor light-emitting chip 11 may become nearly parallel to the side surface of the semiconductor light-emitting chip 11, and therefore light reflected on the part of the side slant surface 130 may not get to the outer detecting surface 51.

Second exemplary embodiments will now be described with reference to FIGS. 8a to 8c. FIGS. 8a to 8c are side cross-section views showing the second exemplary embodiments including a plurality of light-emitting chips of a semiconductor light-emitting device made in accordance with principles of the disclosed subject matter. The plurality of light-emitting chips 11 can be covered by a wavelength converting layer 14 via a transparent material layer 13, which is located between a bottom surface of the wavelength converting layer 14 and top surfaces of the light-emitting chips 11 and around side surfaces of the light-emitting chips 11.

A reflective material layer 15 can be disposed around an outer side surface of the light-emitting chips 11 that faces a frame 16 and can include a side slant surface 130, which is a boundary between the reflective material layer 15 and the transparent material layer 13 and which wholly surrounds the light-emitting chips 11. The side slant surface 130 can be formed in a substantially linear shape connecting an end of the bottom surface of the wavelength converting layer 14 to a bottom end of the outer side surface of the light-emitting chips 11, and also can be formed in a convex shape in an inward direction of the semiconductor light-emitting device as shown in FIGS. 8a to 8c. In this case, the side slant surface 130 can be formed in a curvature of 5 or less due to the same reason as described above with respect to the first embodiment.

The reflective material layer 15 can be disposed between the bottom surfaces of the light-emitting chips 11 and a mounting surface of a base board 10 mounting the light-emitting chips 11 via solder bumps 12 as shown in FIG. 8c. The reflective material layer 15 can be disposed in a convex shape 81 between the bottom surface of the wavelength converting layer 14 and a virtual extending surface of the bottom surfaces of the light-emitting chips 11 in each of the spaces located between the light-emitting chips 11, as shown in FIG. 8b.

Thereby, variations of light intensities emitted from the light-emitting chips 11 can be reduced via the wavelength converting layer 14. In this case, the convex shape 81 of the reflective material layer 15 may extend and possibly contact the bottom surface of the wavelength converting layer 14. A curvature of the convex shape can be 5 or less, similar to the curvature of the side slant surface 130. A description in regard to other structures of the second embodiment is abbreviated because the other structures can be substantially the same as the first embodiment.

A manufacturing method for the second embodiment of the semiconductor light-emitting device shown in FIGS. 8a to 8c can be basically the same as that for the first embodiment shown in FIGS. 3a to 3e. In the structure shown in FIG. 8a, the uncured transparent material 13' can be equally applied on at least one of each top surface of the light-emitting chips 11 and each region of the wavelength converting layer 14 covering each top surface of the light-emitting chips 11. The transparent material layer 13 can be formed so that the side slant surface 130 between the bottom surface of the wavelength converting layer 14 and the outer side surface of the light-emitting chips 11 facing the frame 16 can be formed in a prescribed shape.

However, when the transparent material layer 13 connects each space above or on light-emitting chips 11 to each of the spaces between the adjacent light-emitting chips as shown in FIGS. 8b and 8c, an amount of the uncured transparent material 13' applied on each top surface of the light-emitting chips 11 can vary so that a total amount of the uncured transparent material 13' becomes a predetermined amount.

More specifically, in the structure of the transparent material layer 13 shown in FIG. 8a, when the transparent material layer 13 is formed between the wavelength converting layer 14 and the light-emitting chips 11 using the uncured transparent material 13', the uncured transparent material 13' can be disposed between the bottom surface of the wavelength converting layer 14 and each top surface of the light-emitting chips 11 so that the uncured transparent material 13' can form in a cavity shape from each side surface of the light-emitting chips 11 to the bottom surface of the wavelength converting layer 14.

In the structure of the transparent material layer 13 shown in FIG. 8b, the transparent material 13' can connect each space on or above the light-emitting chips 11 to each of the spaces between the adjacent light-emitting chips 11, and can be formed in a convex shape in a direction of the wavelength converting layer 14 in each of the spaces between the adjacent light-emitting chips 11. Then the transparent material layer 13 can be formed by solidifying the transparent material 13' as shown in FIG. 8b.

In process (e) for disposing the reflective material layer 15, in order to form the convex shape 81 so as to raise the reflective material layer 15 in each of the spaces between the adjacent light-emitting chips 11, a viscosity of the uncured reflective material can be adjusted.

According to the second embodiment of the semiconductor light-emitting device, because the side slant surface 130 of the reflective material layer 15 can be formed from the outer side surface of the light-emitting chips 11 facing the frame 16 to the wavelength converting layer 14, light emitted in crosswise direction of the light-emitting chips 11 can be reflected toward the wavelength converting layer 14. Therefore, the second embodiment of the disclosed subject matter can provide semiconductor light-emitting devices having a high light-emitting efficiency and having a small light-emitting surface, which is the top surface of the wavelength converting layer 14 that is slightly larger than the top surfaces of the light-emitting chips 11.

In addition, because the semiconductor light-emitting device of the second embodiment can prevent a reduction of light intensity between the adjacent light-emitting chips 11 by forming the convex shape 81 in each of the spaces between the adjacent light-emitting chips 11, the disclosed subject matter can provide semiconductor light emitting devices which can reduce a variation of a light intensity on the light-emitting surface.

FIGS. 9a and 9b are cross-section views depicting exemplary comparative embodiments including a plurality of light-emitting chips of a semiconductor light-emitting device. To compare an optical characteristic of Sample A of the second embodiment shown FIG. 8b, Sample B includes reflective material 15 disposed in a cavity formed of the frame 16 and the base board 10 so as to fill a space surrounding the light-emitting chips 11 and the side surface of the wavelength converting layer 14 and so as to exclude the transparent material layer 13 as shown in FIG. 9a. Sample C includes the reflective material 15 disposed between the frame 16 and the side surface of the wavelength converting material 14 so as not to fill a space surrounding the light-emitting chips 11, as shown in FIG. 9b.

Figure 10:
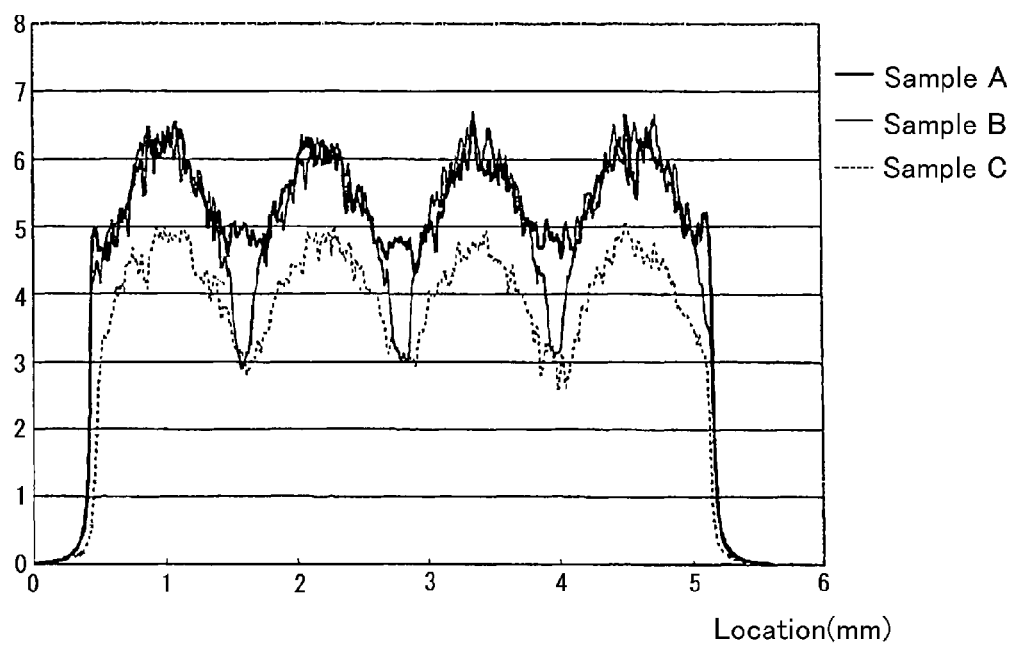
FIG. 10 is a chart showing light intensity distributions on top surfaces of the semiconductor light-emitting devices of the second embodiment of FIG. 8 and the comparative embodiments of FIGS. 9a and 9b.
Figure 11A:
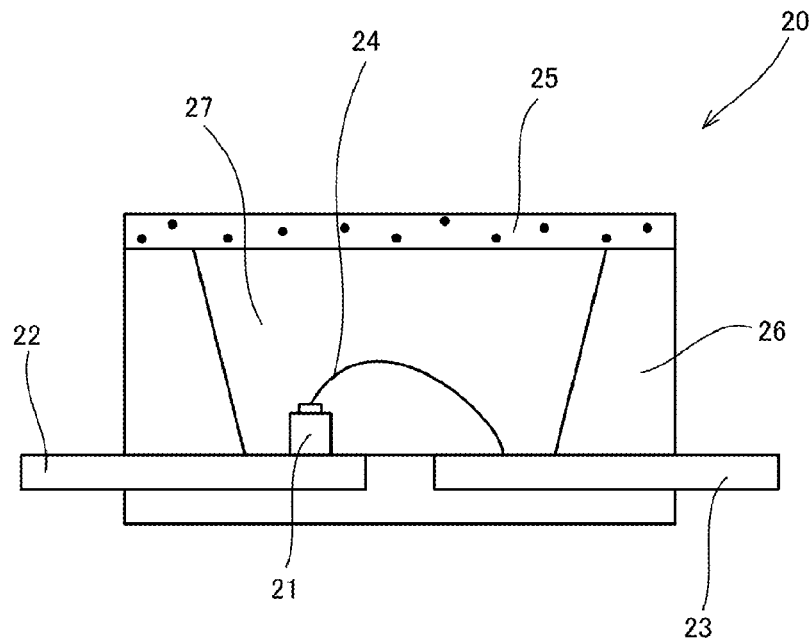
FIGS. 11a and 11b are side cross-section views showing a conventional lead frame type light-emitting device and a conventional radial type light-emitting device, respectively.
Figure 11B:
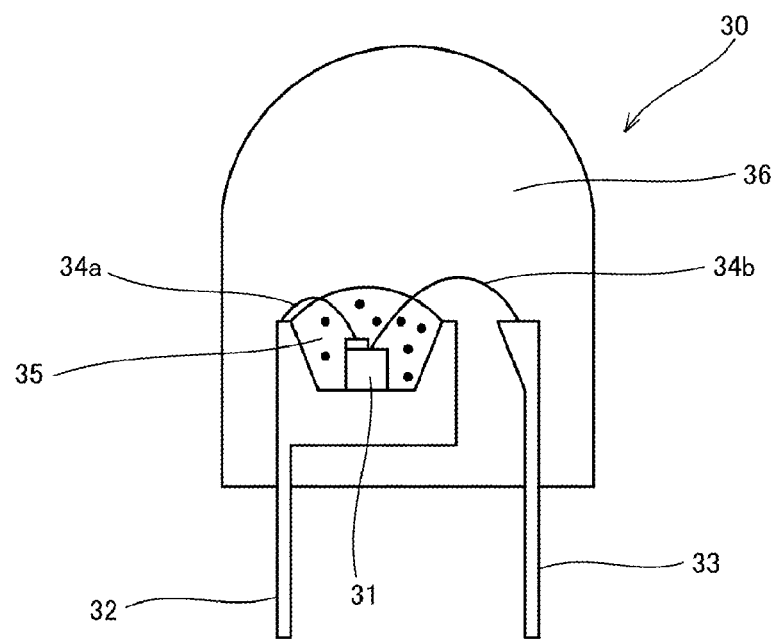
Figure 12:
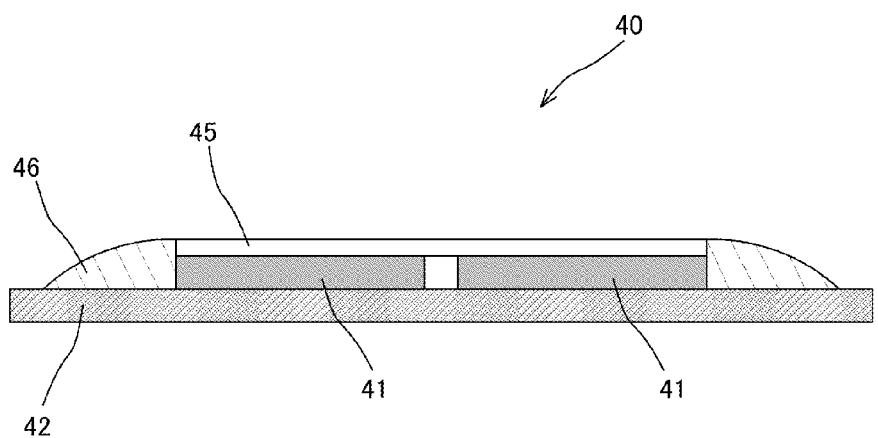
FIG. 12 is a cross-section view showing another conventional semiconductor light-emitting device.

Each of Sample A, Sample B and Sample C that are used for the measurement includes four light-emitting chips 11 to ease a result of the measurement although Samples A to C shown in FIGS. 8b, 9a and 9b include two light-emitting chips 11. FIG. 10 is a chart showing light intensity distributions with respect to locations on top surfaces of Sample A, Sample B and Sample C.

With respect to a light intensity reduction in spaces between the light-emitting chips 11, Sample A of the second embodiment is smaller than Sample B and Sample C of the comparative embodiments, and Sample A can reduce a variation of the light intensity in the spaces between the light-emitting chips 11. On the other hand, Sample B may emit light having the substantially same light intensity as Sample A on a central portion of the light-emitting surface, however, light intensities emitted from edges of the light-emitting surface to the spaces between the light-emitting chips 11 may be extremely reduced. In addition, light intensities of Sample C may become low wholly on the light-emitting surface.

The first embodiment having the structure of FIG. 1 of the disclosed subject matter made in accordance with the manufacturing method shown in FIGS. 3a to 3e is described. The manufacturing method for the first embodiment can include: preparing a base board 10 by mounting a flip chip type semiconductor light-emitting chip 11 having a square of 1 millimeter and a thickness of 100 micro meters thereon; applying a silicone resin of $2.3 \times 10^{-5}$ ml as the uncured transparent material 13' on a top surface of the light-emitting chip 11; mounting a YAG plate having a square of 1.2 millimeters as the wavelength converting layer 14 on the uncured transparent material 13'; heating at 150 degrees centigrade for 4 hours to solidify the silicone resin; attaching a ceramic ring as the frame 16 on the base board 10 via a silicone resin and solidifying the silicone resin at 150 degrees centigrade for 4 hours; disposing a silicone resin including a filler of $T_iO_2$ as the reflective material layer 15 between the frame 16 and both side surfaces of the wavelength converting layer 14 and the light-emitting chip 11, and solidifying the silicone resin at 150 degrees centigrade for 4 hours; and finishing a semiconductor light emitting device having the structure of FIG. 1.

The second embodiment having the structure of FIG. 8a of the disclosed subject matter made in accordance with the manufacturing method shown in FIGS. 3a to 3e is described. The manufacturing method for the second embodiment can include: preparing a base board 10 by mounting two flip chip type semiconductor light-emitting chips 11 having a square of 1 millimeter and a thickness of 100 micro meters thereon so that a space between the two chips 11 becomes 200 micro meters; applying a silicone resin of $2.3 \times 10^{-5}$ ml as the uncured transparent material 13' on each of the top surfaces of the light-emitting chips 11; mounting a YAG plate having a rectangular shape of 1.2×2.4 millimeters as the wavelength converting layer 14 on the uncured transparent material 13'; heating at 150 degrees centigrade for 4 hours to solidify the silicone resin; attaching a ceramic ring as the frame 16 on the base board 10 via a silicone resin and solidifying the silicone resin at 150 degrees centigrade for 4 hours; disposing a silicone resin including a filler of $T_iO_2$ as the reflective material layer 15 between the frame 16 and both side surfaces of the wavelength converting layer 14 and the light-emitting chips 11, and solidifying the silicone resin at 150 degrees centigrade for 4 hours; and finishing a semiconductor light emitting device having the structure of FIG. 8a.

As described above, the disclosed subject matter can form a light-emitting surface in a small shape such that is slightly larger than the top surface of the semiconductor light-emitting chip 11, and can improve a light-emitting efficiency by using the side slant surface 130 of the reflective material layer 15 as a reflector for the light-emitting chip 11. In addition, even when a plurality of light-emitting chips 11 is mounted on the base board 10, a variation of a light intensity between the light-emitting chips 11 can be reduced. Thus, the disclosed subject matter can provide a semiconductor light-emitting device having a small light-emitting surface and a high light-emitting efficiency, which can be used for lighting units such as a vehicle headlight that controls light emitted from the light-emitting device using a reflector and/or a projector lens.

Moreover, the side slant surface 130 can be formed by disposing the uncured transparent material 13' on the top surface of the light-emitting chip 11 and by disposing the uncured reflective material between the frame 16 and at least the transparent material layer 13 without a mechanical process. Thus, the method of the disclosed subject matter can provide a semiconductor light-emitting device capable of being used as a lighting unit such as a headlight using manufacturing machines that are similar to those used to manufacture conventional semiconductor light-emitting devices.

Furthermore, the above-described embodiments are mainly described as a light source device for a vehicle headlight. However, the semiconductor light-emitting device can incorporate various colored lights by combining the above-described semiconductor chip 11 with the wavelength converting layer 14 including at least one phosphor, and therefore can also be used as a light source device for various applications such as general lighting, a street light, stage lighting, traffic lights and the like using a small and simple optical member. In addition, it is conceived that each of the different aspects and features of the different embodiments disclosed herein could be used interchangeably in and with the other disclosed embodiments. For example, the multiple chip embodiment could include slant surfaces 130 that are concave. In addition, one side of a device can include a slant surface 130 that is convex while another side of the device includes a slant surface 130 that is concave. In addition, it is contemplated that any different color chip or different wavelength material can be used in any of the disclosed embodiments and in any combination.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light-emitting device comprising:
   a base board having a mounting surface and a conductor pattern formed on the mounting surface;
   a semiconductor light-emitting chip having a bottom surface, a top surface and a side surface, and including chip electrodes adjacent the bottom surface, each of the chip electrodes electrically connected to a respective portion of the conductor pattern of the base board via solder bumps;
   a wavelength converting layer having a bottom surface and a side surface, the wavelength converting layer including at least one phosphor, and located over the top surface of the semiconductor light-emitting chip so that the bottom surface of the wavelength converting layer covers the top surface of the semiconductor light-emitting chip;
   a transparent material layer having a side surface disposed between the bottom surface of the wavelength converting layer and the side surface of the semiconductor light-emitting chip so that the side surface of the transparent material layer extends from the side surface of the semiconductor light-emitting chip toward the bottom surface of the wavelength converting layer;

a frame located adjacent the mounting surface of the base board so as to surround the semiconductor light-emitting chip and the transparent material layer; and a reflective material layer having a side slant surface disposed at least between the frame and both the side surface of the wavelength converting layer and the side surface of the transparent material layer and between the bottom surface of the semiconductor light-emitting chip and the mounting surface of the base board while surrounding the solder bumps, wherein the side slant surface contacts with the side surface of the transparent material layer and extends from the side surface of the semiconductor light-emitting chip toward the bottom surface of the wavelength converting layer.

2. The semiconductor light-emitting device according to claim 1, wherein the semiconductor light-emitting chip is a blue light-emitting chip and the at least one phosphor of the wavelength converting layer is selected from the group consisting of a yellow phosphor, and two phosphors including a red phosphor layer and a green phosphor layer.

3. The semiconductor light-emitting device according to claim 1, wherein the semiconductor light-emitting chip is an ultraviolet light-emitting chip and the at least one phosphor of the wavelength converting layer includes at least one of a red phosphor, a green phosphor, and a blue phosphor.

4. The semiconductor light-emitting device according to claim 1, further comprising a plurality of semiconductor light-emitting chips.

5. A method for manufacturing the semiconductor light-emitting device according to claim 1, comprising:
providing the base board;
connecting each of the chip electrodes of the semiconductor light-emitting chip to a respective portion of the conductor pattern of the base board via the solder bumps;
disposing an uncured transparent material between the bottom surface of the wavelength converting layer and the side surface of the semiconductor light-emitting chip so as to extend from the side surface of the semiconductor light-emitting chip toward the bottom surface of the wavelength converting layer; and
disposing an uncured reflective material at least between the frame and both the side surface of the wavelength converting layer and the side surface of the transparent material layer and between the bottom surface of the semiconductor light-emitting chip and the mounting surface of the base board.

6. The method for manufacturing the semiconductor light-emitting device according to claim 5, wherein the semiconductor light-emitting chip is a blue light-emitting chip and the at least one phosphor of the wavelength converting layer is selected from the group consisting of a yellow phosphor, and two phosphors including a red phosphor layer and a green phosphor layer.

7. The semiconductor light-emitting device according to claim 1, wherein the side slant surface of the reflective material layer is formed in at least one of a substantially linear shape and a convex shape having a curvature of 5 or less extending in a direction toward the semiconductor light-emitting chip between the side surface of the semiconductor light-emitting chip and the bottom surface of the wavelength converting layer.

8. The semiconductor light-emitting device according to claim 7, wherein the semiconductor light-emitting chip is a blue light-emitting chip and the at least one phosphor of the wavelength converting layer is selected from the group consisting of a yellow phosphor, and two phosphors including a red phosphor layer and a green phosphor layer.

9. The semiconductor light-emitting device according to claim 7, wherein the semiconductor light-emitting chip is an ultraviolet light-emitting chip and the at least one phosphor of the wavelength converting layer includes at least one of a red phosphor, a green phosphor, and a blue phosphor.

10. A method for manufacturing the semiconductor light-emitting device according to claim 7, comprising:
providing the base board;
connecting each of the chip electrodes of the semiconductor light-emitting chip to a respective portion of the conductor pattern of the base board via the solder bumps;
disposing an uncured transparent material between the bottom surface of the wavelength converting layer and the side surface of the semiconductor light-emitting chip so as to extend from the side surface of the semiconductor light-emitting chip toward the bottom surface of the wavelength converting layer; and
disposing an uncured reflective material at least between the frame and both the side surface of the wavelength converting layer and the side surface of the transparent material layer and between the bottom surface of the semiconductor light-emitting chip and the mounting surface of the base board.

11. A semiconductor light-emitting device comprising:
a base board having a mounting surface and a conductor pattern formed on the mounting surface;
a plurality of semiconductor light-emitting chips each having a bottom surface, a top surface and an outer side surface, and each including chip electrodes adjacent the bottom surface, each of the chip electrodes electrically connected to a respective portion of the conductor pattern of the base board via solder bumps so that the plurality of semiconductor light-emitting chips is located adjacent each other;
a wavelength converting layer having a bottom surface and a side surface, the wavelength converting layer including at least one phosphor, and located over the top surface of each of the semiconductor light-emitting chips so that the bottom surface of the wavelength converting layer covers the top surface of each of the semiconductor light-emitting chips;
a transparent material layer having a side surface disposed between the bottom surface of the wavelength converting layer and the outer side surface of at least one of the semiconductor light-emitting chips so that the side surface of the transparent material layer extends from the outer side surface of the at least one of the semiconductor light-emitting chips toward the bottom surface of the wavelength converting layer;
a frame located adjacent the mounting surface of the base board so as to surround the transparent material layer and the semiconductor light-emitting chips while facing the outer side surface of the at least one of the semiconductor light-emitting chips; and
a reflective material layer having a side slant surface disposed at least between the frame and both the side surface of the wavelength converting layer and the side surface of the transparent material layer and between the bottom surface of at least one of the semiconductor light-emitting chips and the mounting surface of the base board while surrounding the solder bumps, wherein the side slant surface contacts with the side surface of the transparent material layer and extends from the outer side surface of the at least one of the semiconductor light-emitting chips toward the bottom surface of the wavelength converting layer.

12. The semiconductor light-emitting device according to claim 11, wherein a boundary between the transparent material layer and the reflective material layer is formed in a convex shape extending in a direction toward the wavelength converting layer in spaces between adjacent semiconductor light-emitting chips.

13. The semiconductor light-emitting device according to claim 11, wherein the plurality of semiconductor light-emitting chips includes a blue light-emitting chip and the at least one phosphor of the wavelength converting layer is selected from the group consisting of a yellow phosphor, and two phosphors including a red phosphor layer and a green phosphor layer.

14. The semiconductor light-emitting device according to claim 11, wherein the plurality of semiconductor light-emitting chips includes an ultraviolet light-emitting chip and the at least one phosphor of the wavelength converting layer includes at least one of a red phosphor, a green phosphor, and a blue phosphor.

15. A method for manufacturing the semiconductor light-emitting device according to 7, comprising:
providing the base board;
connecting each of the chip electrodes of the semiconductor light-emitting chips to a respective portion of the conductor pattern of the base board via the solder bumps;
disposing an uncured transparent material between the bottom surface of the wavelength converting layer and the outer side surface of the at least one of the semiconductor light-emitting chips so as to extend from the outer side surface of the at least one of the semiconductor light-emitting chips toward the bottom surface of the wavelength converting layer; and
disposing an uncured reflective material at least between the frame and both the side surface of the wavelength converting layer and the side surface of the transparent material layer and between the bottom surface of at least one of the semiconductor light-emitting chips and the mounting surface of the base board.

16. The method for manufacturing a semiconductor light-emitting device according to claim 15, wherein the plurality of semiconductor light-emitting chips includes a blue light-emitting chip and the at least one phosphor of the wavelength converting layer is selected from the group consisting of a yellow phosphor, and two phosphors including a red phosphor layer and a green phosphor layer.

17. The semiconductor light-emitting device according to claim 11, wherein the side slant surface of the reflective material layer is formed in at least one of a substantially linear shape and a convex shape having a curvature of 5 or less and extending in a direction toward the semiconductor light-emitting chips, and is located between the outer side surface of the at least one of the semiconductor light-emitting chips and the bottom surface of the wavelength converting layer.

18. The semiconductor light-emitting device according to claim 17, wherein a boundary between the transparent material layer and the reflective material layer is formed in a convex shape having a curvature of 5 or less and extending in a direction toward the wavelength converting layer in spaces between adjacent semiconductor light-emitting chips.

19. The semiconductor light-emitting device according to claim 17, wherein the plurality of semiconductor light-emitting chips includes a blue light-emitting chip and the at least one phosphor of the wavelength converting layer is selected from the group consisting of a yellow phosphor, and two phosphors including a red phosphor layer and a green phosphor layer.

20. The semiconductor light-emitting device according to claim 17, wherein the plurality of semiconductor light-emitting chips includes an ultraviolet light-emitting chip and the at least one phosphor of the wavelength converting layer includes at least one of a red phosphor, a green phosphor, and a blue phosphor.

21. A method for manufacturing the semiconductor light-emitting device according to 17, comprising:
providing the base board;
connecting each of the chip electrodes of the semiconductor light-emitting chips to a respective portion of the conductor pattern of the base board via the solder bumps;
disposing an uncured transparent material between the bottom surface of the wavelength converting layer and the outer side surface of the at least one of the semiconductor light-emitting chips so as to extend from the outer side surface of the at least one of the semiconductor light-emitting chips toward the bottom surface of the wavelength converting layer; and
disposing an uncured reflective material at least between the frame and both the side surface of the wavelength converting layer and the side surface of the transparent material layer and between the bottom surface of at least one of the semiconductor light-emitting chips and the mounting surface of the base board.

* * * * *